(12) United States Patent
Odom et al.

(10) Patent No.: US 7,089,466 B2
(45) Date of Patent: Aug. 8, 2006

(54) INSTRUMENTATION SYSTEM HAVING A RECONFIGURABLE INSTRUMENTATION CARD WITH PROGRAMMABLE LOGIC AND A MODULAR DAUGHTER CARD

(75) Inventors: Brian Keith Odom, Georgetown, TX (US); Cary Paul Butler, Austin, TX (US); Jeremy Willden, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 558 days.

(21) Appl. No.: 10/194,720

(22) Filed: Jul. 12, 2002

(65) Prior Publication Data

US 2004/0010739 A1 Jan. 15, 2004

(51) Int. Cl.
*G01R 31/28* (2006.01)
(52) U.S. Cl. .................. 714/724; 714/38; 715/771
(58) Field of Classification Search ................ 714/724, 714/718, 725, 38, 47; 717/1, 2, 3, 12; 715/771
See application file for complete search history.

(56) References Cited

U.S. PATENT DOCUMENTS

| | | | | |
|---|---|---|---|---|
| 5,323,291 A | * | 6/1994 | Boyle et al. .................. 361/686 |
| 5,347,425 A | * | 9/1994 | Herron et al. ............... 361/686 |
| 5,440,755 A | | 8/1995 | Harwer et al. |
| 5,446,869 A | | 8/1995 | Padgett et al. |
| 5,627,998 A | | 5/1997 | Mondrik et al. |
| 5,628,637 A | | 5/1997 | Pecone et al. |
| 5,853,303 A | * | 12/1998 | Brunker et al. ............. 439/637 |
| 6,050,940 A | * | 4/2000 | Braun et al. ................. 600/300 |
| 6,141,744 A | * | 10/2000 | Wing So ...................... 712/35 |
| 6,173,438 B1 | | 1/2001 | Kodosky et al. |
| 6,186,663 B1 | * | 2/2001 | Ausnit .......................... 383/63 |
| 6,219,628 B1 | | 4/2001 | Kodosky et al. |
| 6,226,682 B1 | * | 5/2001 | Murray ....................... 709/236 |
| 6,311,149 B1 | | 10/2001 | Ryan et al. |
| 6,418,026 B1 | * | 7/2002 | Ho et al. ..................... 361/727 |
| 6,540,522 B1 | * | 4/2003 | Sipe ............................ 439/61 |
| 6,784,903 B1 | * | 8/2004 | Kodosky et al. ............ 715/771 |
| 2003/0105609 A1 | * | 6/2003 | Conway et al. ............. 702/124 |

* cited by examiner

*Primary Examiner*—Albert Decady
*Assistant Examiner*—Fritz Alphonse
(74) *Attorney, Agent, or Firm*—Meyertons Hood Kivlin Kowert & Goetzel, P.C.; Jeffrey C. Hood

(57) ABSTRACT

An instrumentation system may include a base card that is configurable to perform multiple instrumentation tasks. The base card includes a programmable logic device (PLD) that is configured according to a hardware description. One of a plurality of possible daughter cards, e.g., a first daughter card or a second daughter card, may be coupled to the base card. One or more of: 1) providing a selected hardware description to the PLD; or 2) coupling of a selected daughter card to the base card may configure the reconfigurable instrumentation card to perform a desired instrumentation function. Thus, by selecting which of the daughter cards is coupled to the base card and/or by selecting which hardware description is used to configure the PLD, the base card may be reconfigured to perform different sets of instrumentation tasks.

80 Claims, 10 Drawing Sheets

INSTRUMENTATION SYSTEM HAVING A RECONFIGURABLE INSTRUMENTATION CARD WITH PROGRAMMABLE LOGIC AND A MODULAR DAUGHTER CARD

FIELD OF THE INVENTION

The present invention relates to the field of instrumentation and data acquisition systems and, more particularly, to instrumentation cards.

DESCRIPTION OF THE RELATED ART

An instrument is a device that collects data or information from an environment or unit under test (UUT) and displays this information to a user. An instrument may also analyze and process acquired data prior to displaying the data to the user. An instrument may provide test stimuli to a ULUT. Typical instruments include oscilloscopes, digital multimeters, pressure sensors, arbitrary waveform generators, etc., and the type of information which may be collected by respective instruments includes voltage, resistance, distance, velocity, pressure, frequency of oscillation, humidity, or temperature, among others.

Scientists and engineers often use instrumentation or DAQ (data acquisition) systems to perform a variety of functions, including test and measurement, laboratory research, process monitoring and control, data logging, analytical chemistry, test and analysis of physical phenomena, and control of mechanical or electrical machinery, to name a few examples.

In the past, many instrumentation systems included individual instruments that were physically interconnected with each other. Each instrument typically included a physical front panel with its own peculiar combination of indicators, knobs, or switches. In order to be able to use such an instrumentation system, a user had to understand and manipulate individual controls for each instrument and record readings from an array of indicators. As a result, acquisition and analysis of data in such instrumentation systems tended to be tedious and error prone.

With the introduction of computers, it became possible to provide more flexible means for interfacing instruments with a user. In computerized instrumentation systems, the user may interact with an instrumentation system through a host computer system instead of a manually operated front panel. Software executing on the computer system may be used to simulate the operation of various instruments in software or to control or communicate with one or more real world instruments. In either case, the software created/controlled instruments may be referred to as virtual instruments.

Computer-based instrumentation systems typically include transducers for transducing a physical phenomenon into electrical signals, signal conditioning logic to perform amplification, isolation, and/or filtering, and analog-to-digital (A/D) conversion logic for receiving analog signals and providing corresponding digital signals to the host computer system.

In a computer-based system, the instrumentation hardware or device is typically an expansion card plugged into one of the I/O slots of the computer system. In another common instrumentation system configuration, the instrumentation hardware is coupled to the computer system via other means such as through a VXI (VME eXtensions for Instrumentation) bus, a PXI (PCI eXtensions for Instrumentation) bus, a GPIB (General Purpose Interface Bus), a serial port or bus, or parallel port of the computer system. The instrumentation hardware may be a DAQ card, a computer-based instrument such as a multimeter, or another type of instrumentation device.

The instrumentation device enables the computerized measurement and generation of real world analog and digital signals. The instrumentation device, e.g., a DAQ device, a multimeter device, etc., typically includes one or more analog to digital (A/D) converters (ADCs), digital to analog (D/A) converters (DACs), digital I/O ports, and counter/timer circuits.

The instrumentation hardware may be configured and controlled by software executing on the computer system. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic or straightforward.

Instrumentation driver software provides a high-level interface to the operations of the instrumentation device. The instrumentation driver software may operate to configure the instrumentation device for communication with the host system and to initialize hardware and software to a known state. The instrumentation driver software also generally maintains a soft copy of the state of the instrument and initiated operations. Further, the instrumentation driver software communicates over the bus to move the device from state to state and to respond to device requests.

Due to the variety of possible measurement functions and test scenarios, numerous different types of measurement devices have been developed. As a result, customers often have to purchase a different measurement card for each different measurement function needed to be performed in a given test scenario. Accordingly, it is desirable to provide a single measurement device that is reconfigurable to perform several different measurement functions.

SUMMARY OF THE INVENTION

Various embodiments of an instrumentation system that includes a reconfigurable instrumentation card are disclosed. In one embodiment, an instrumentation system includes a base card that is configurable to perform multiple instrumentation tasks. The base card includes a programmable logic device (PLD) that is configured according to a hardware description. One of a plurality of possible daughter cards, e.g., a first daughter card or a second daughter card, may be coupled to the base card. One or more of: 1) providing a selected hardware description to the PLD; or 2) coupling of a selected daughter card to the base card may configure the reconfigurable instrumentation card to perform a desired instrumentation function. In one embodiment, the user may select both the hardware description for the PLD and a particular type of daughter card when reconfiguring the reconfigurable instrumentation card. For example, if the first daughter card is coupled to the base card, the PLD may be configured according to a first hardware description and the base card may be configured to perform a first portion of the instrumentation tasks. If the second daughter card is coupled to the base card, the PLD may be configured according to a second hardware description and the base card may be configured to perform a second portion of the instrumentation tasks. Thus, by selecting which of the daughter cards is coupled to the base card and/or by selecting which hardware description is used to configure the PLD, the base card may be reconfigured to perform different sets of instrumentation tasks. Instrumentation tasks may include timing, storage, and/or data processing tasks in some embodiments.

In another embodiment, an instrumentation system may include a host computer system and an instrumentation card coupled to the host computer system. The instrumentation card is configurable to perform a plurality of instrumentation tasks and includes a base card that includes a PLD and at least one daughter card. The type of the daughter card(s) coupled to the base card determines which hardware description is used to configure the PLD and which portion of the instrumentation tasks the instrumentation card is currently configured to perform. Note that the hardware description may be selected from several different hardware descriptions that are compatible with the daughter card(s) currently coupled to the base card.

BRIEF DESCRIPTION OF THE DRAWINGS

A better understanding of the present invention can be obtained when the following detailed description of the preferred embodiment is considered in conjunction with the following drawings, in which.

Figure 1:
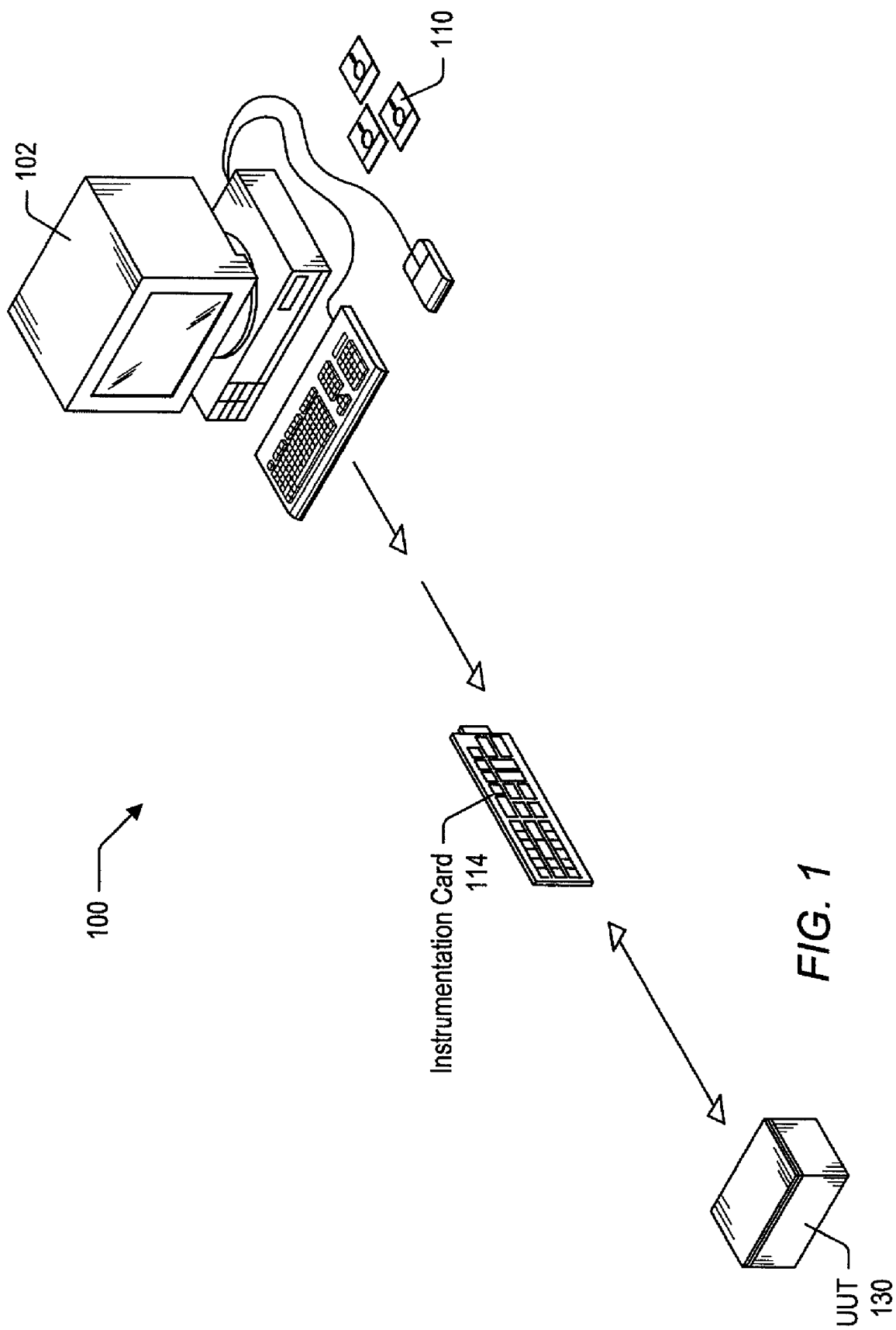
FIG. 1 illustrates one embodiment of a computer-based instrumentation system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include" and derivations thereof mean "including, but not limited to." The term "connected" means "directly or indirectly connected," and the term "coupled" means "directly or indirectly connected."

DETAILED DESCRIPTION OF THE EMBODIMENTS

Incorporation by Reference

The following U.S. Patent is hereby incorporated by reference in its entirety as though fully and completely set forth herein.

U.S. Pat. No. 6,219,628, titled "System and method for configuring an instrument to perform measurement functions utilizing conversion of graphical programs into hardware implementations," issued on Apr. 17, 2001.

Figure 2:
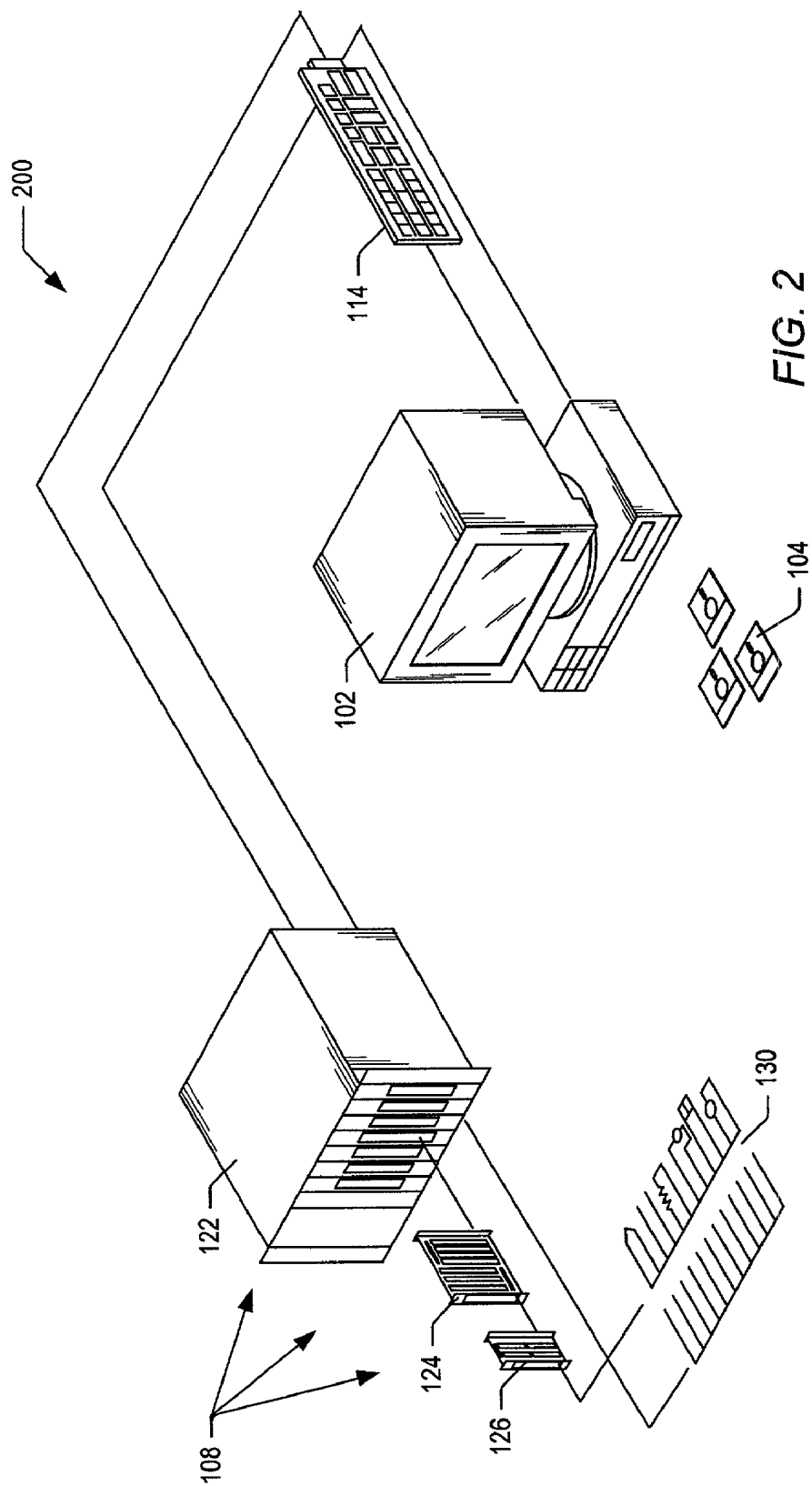
FIG. 2 shows another embodiment of an instrumentation system.

FIGS. 1 and 2—Instrumentation Systems

FIG. 1 illustrates one embodiment of an instrumentation control system 100. The system 100 may include a computer 102, which is connected to one or more instrumentation cards 114. The computer system 102 may include various standard elements, including at least one central processing unit (CPU), memory, a hard drive, one or more buses, a power supply, a display screen, and one or more input devices such as a mouse or keyboard. The host computer 102 also preferably includes a non-volatile media, such as a magnetic media, e.g., a hard drive, or optical storage, as well as system memory, such as DRAM, SRAM, etc. For illustration purposes, the instrumentation card 114 is shown outside the computer 102. However, the instrumentation card 114 may be located within the chassis of the computer 102 in some embodiments. Alternatively, the instrumentation card 114 may be a device external to the computer 102 that is coupled to the unit under test (UUT) or process under test and to the computer 102. The computer 102 may connect through the one or more instrumentation cards 114 to analyze, measure, or control a unit under test (UUT) or process under test 130.

The instrumentation card(s) 114 may be coupled to the computer 102 by one or more I/O slots (not shown) provided by the computer 102. The instrumentation card 114 may, in some embodiments, couple directly to an I/O slot. In other embodiments, the instrumentation card 114 may be indirectly coupled to an I/O slot. For example, the instrumentation card may be coupled to an I/O slot through a serial bus (e.g., an IEEE 1394 bus). The instrumentation card(s) 114 may couple through one or more sensors or transducers (also not shown) to the UUT 130.

The system 100 may be used in a data acquisition and control application, in a test and measurement application, a process control application, or a man-machine interface application.

FIG. 2 shows another illustrative instrumentation system 200. The instrumentation system 200 may include a computer system 102, an instrumentation card 114, and a signal conditioning system 108. As in FIG. 1, the instrumentation card 114 may be an external device coupled to the computer system through an external interface or, alternatively, an internal device coupled to the computer system through an I/O slot. The I/O slot in the computer 102 may be a PCI bus slot, a PC Card slot, or an ISA, EISA or MicroChannel bus slot. The instrumentation card 114 may be coupled to a UUT 130 through the signal conditioning system 108 and one or more sensors or transducers.

The signal conditioning system 108 may include a signal conditioning chassis, e.g., an SCXI (Signal Conditioning eXtensions for Instrumentation) chassis 122, an SCXI module 124 and one or more SCXI terminal blocks 126. The SCXI chassis 122 may have one or more SCXI modules 124.

Figure 3:
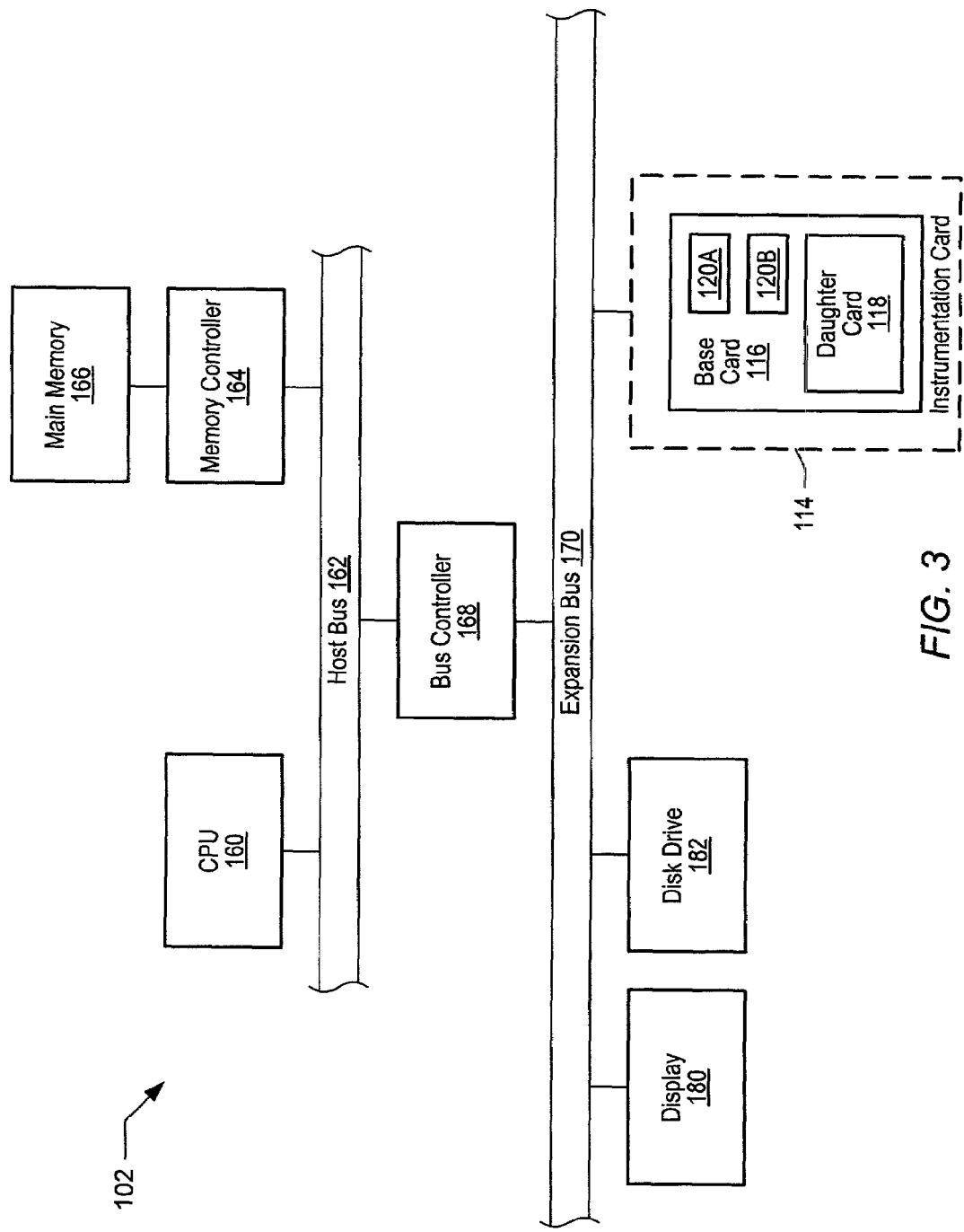
FIG. 3 is a block diagram of one embodiment of a computer system.

FIG. 3—Computer System

FIG. 3 shows a block diagram of one embodiment of the computer 102 illustrated in FIGS. 1 and 2. It is noted that any type of computer configuration or architecture may be used, and FIG. 3 illustrates a representative PC embodiment. It is also noted that the computer system may be a general purpose computer as shown in FIGS. 1 and 2, a computer implemented on a VXI card installed in a VXI chassis, a computer implemented on a PXI card installed in a PXI chassis, etc. For simplicity, the elements of a computer not necessary to understand the operation of the present invention have been omitted.

In the illustrated embodiment, the computer 102 includes at least one central processing unit (CPU) 160, which is coupled to a processor or host bus 162. The CPU 160 may be any of various types (e.g., a Pentium class, a PowerPC processor, a CPU from the SPARC family of RISC processors, etc.). Main memory 166 is coupled to the host bus 162 by means of memory controller 164.

The main memory 166 may store a component development system and software components or objects and associated software. The main memory 166 may also store instrumentation software and various other software, such as operating system software and the software for the operation of the computer system.

The host bus 162 is coupled to an expansion or input/output bus 170 by means of a bus controller 168 or bus bridge logic. The expansion bus 170 is preferably the PCI (Peripheral Component Interconnect) expansion bus, although other bus types may be used. The expansion bus 170 may include slots for various devices such as the instrumentation card 142, GPIB (General Purpose Interface Bus) card, etc. The computer 102 may also include a display subsystem 180 and a disk drive 182 that are coupled to the expansion bus 170.

An instrumentation card 114 may be coupled to the computer system by the expansion bus 170. The instrumentation card includes a base card 116 and one or more daughter cards 118.

The base card 116 may be configured to accept various different daughter cards (each of which is referred to as a daughter card 118). The base card 116 may include one or more programmable logic devices (PLDs) 120A and/or 120B (collectively, PLDs 120), such as FPGAs (Field Programmable Gate Arrays), PALs (Programmable Array Logic), PLAs (Programmable Logic Array), EPLDs (Erasable PLDs), PEELs (Programmable Electrically Erasable Logic), GALs (Generic Array Logic), etc. The base card 116 may also include one or more non-reconfigurable processors in some embodiments.

The instrumentation card 114 may be reconfigured by attaching different daughter cards 118 to base card 116 and/or by reconfiguring one or more of the PLDs 120. The host system may reprogram a PLD 120 by supplying a new hardware description for that PLD 120. As part of the reconfiguration of the instrumentation card 114, the host system may also supply a new set of instructions for the base card's PLD(s) and/or processors or CPUs to execute. For example, the host system may modify the instrumentation card's functionality by providing both a new hardware description to configure the PLD 120 and a new set of instructions for the configured PLD 120 (and/or for a processor included in the base card) to execute.

In some embodiments, memory 166 may store a program, such as a graphical program (e.g., created using software such as LabVIEW), that implements one or more instrumentation functions. The host system may use the program to reconfigure the instrumentation card to perform the instrumentation functions. For example, another software program stored in memory 166 may be executed by CPU 160 to generate a hardware description from at least a portion of the program that implements the instrumentation functions. The hardware description may be used to program a PLD 120 included on the base card to implement at least a portion of the instrumentation function(s). The software program may also generate a series of instructions from the remaining portions of the program that implements the instrumentation functions. These instructions may be executable by the programmed PLD 120 (and/or by a processor included in the base card 116) to perform the remaining portions of the program that implements the instrumentation functions.

FIG. 4—Base Card

Figure 4:
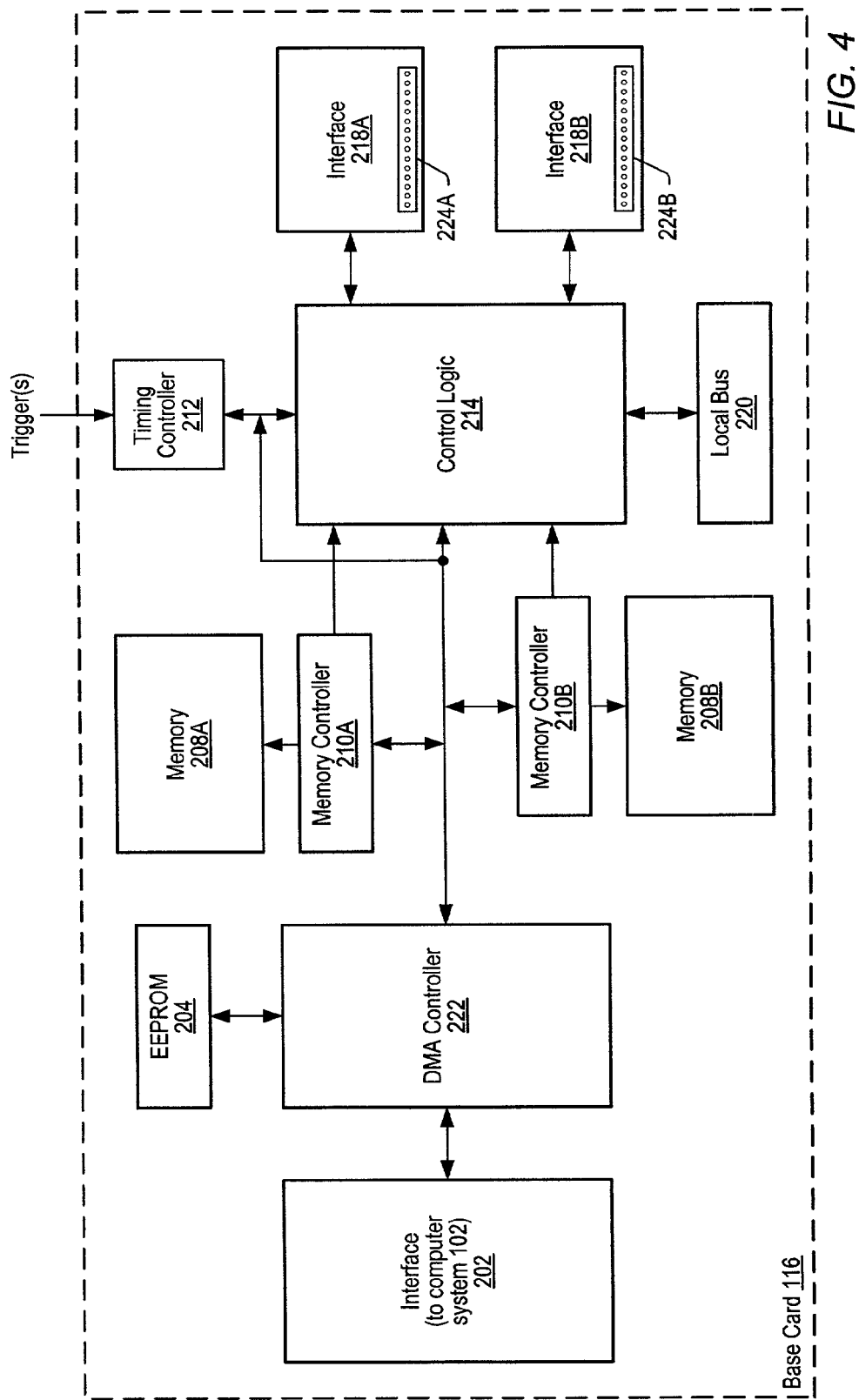
FIG. 4 is a block diagram of one embodiment of a base card.

FIG. 4 shows one embodiment of a base card 116 that may be included in instrumentation card 114. The base card 116 may be designed so that it may be included in several different instrumentation card configurations, which may reduce instrumentation system costs and/or time to market through design reuse and/or the increased use of common components. For example, different embodiments of base card 116 may be implemented for different instrumentation system platforms (e.g., PXI, PCI, PCI Express (also referred to as 3GIO), Compact PCI, IEEE 1394 (also referred to as FireWire), etc.). Each embodiment of a base card 116 may include one or more appropriately configured interfaces (e.g., such as interface 202) for interfacing with a host computer system 102 in a respective platform. In some embodiments, base card 116 may be configured to couple directly to a slot in the host computer system 102. In other embodiments, the base card 116 may be included in a remote chassis that is coupled to the host computer system (e.g., through a serial cable such as an IEEE 1394 cable).

Each embodiment of base card 116 may include one or more daughter card interfaces 218A and/or 218B for interfacing to a daughter card 118. In many embodiments, each of the different types of base cards may be compatible with the same daughter cards, allowing the daughter cards to be platform-independent. This may allow instrumentation card developers to reuse daughter card designs when developing instrumentation cards for multiple platforms. Each different instrumentation card configuration may be defined (at least in part) by which daughter card(s) are currently coupled to the base card. As a result, the base card/daughter card architecture may allow users to effectively purchase different functionality by purchasing the appropriate daughter cards to implement that functionality.

As shown, the base card 116 may include control logic 214. As mentioned above, this control logic 214 may be implemented in one or more PLDs in some embodiments, allowing certain functionality to be reprogrammed by a host computer system. For example, the control logic 214 may be implemented in an FPGA. The control logic 214 may also include a non-reconfigurable processor or CPU or a PLD programmed as a processor or CPU. In one such embodiment, the processor or CPU may be configured to perform primarily data processing functions and the PLD may be configured to perform primarily data transferring functions (e.g., to transfer data from the host computer system to an attached daughter card and/or from an attached daughter card to the host computer system).

The control logic 214 may be configured to perform various instrumentation tasks such as waveform generation and receiving and processing data output by a UUT. In some embodiments, the control logic 214 may be configured to perform the various instrumentation tasks in response to instructions stored in the memories 208A and 208B (collectively referred to as memory 208). In some embodiments, the control logic 214 may support system-wide synchronization of multiple devices in an instrumentation system. Control logic 214 may perform instrumentation operations as well as operations that control the base card 116.

The host computer system may be configured to program (and reprogram) the control logic 214 by providing a new hardware description and/or by supplying a new set of instructions for the PLD (and/or a non-reconfigurable processor or CPU included as part of the base card) to execute. This enables the control logic 214 to perform different operations. Several different hardware descriptions and/or instructions executable by a configured PLD may be stored in memory in the host computer system. In one embodiment, some or all of the different hardware descriptions may be stored on a server maintained by a manufacturer of the base card 116 and/or daughter card 118. A client computer system may access this server in order to obtain hardware descriptions and/or instructions used to configure the base card 116. In such an embodiment, clients may be provided with the most recently updated version of the hardware description and/or instructions each time they access the manufacturer's server. In other embodiments, client computer systems may store the different hardware descriptions and instructions. The client may access the manufacturer's server to determine whether any hardware descriptions or instructions have been updated.

The host computer system may select one of the hardware descriptions and/or instructions depending on the desired functionality (e.g., as indicated by which daughter card(s) are currently coupled to the base card 116) and provide the selected hardware descriptions and/or instructions to the PLD(s) on the base card. For example, in one embodiment, each daughter card 118 may have a unique ID number. The host computer system may read this ID number and provide an appropriate hardware description and/or appropriate instructions to the base card 116 dependent on which daughter card(s) are currently coupled to the base card 116. If several hardware descriptions and/or instructions may be used with a given base card/daughter card combination, the host computer system may provide a pop-up menu to a user, allowing the user to select which hardware description and/or instructions are used to configure the base card. In one embodiment, the host computer system may be running an application such as LabVIEW FPGA, which may be used to create at least a portion of the hardware description for a given configuration as described above. By configuring the PLD according to different hardware descriptions, and/or by providing different instructions to the PLD and/or processor or CPU to be executed, different operations may be performed by the base card 116. Accordingly, by reprogramming which operations the base card 116 performs and/or attaching different daughter cards 118 to the base card, an instrumentation card 114 may be given different personalities.

In addition to the control logic 214, the base card may include an interface 202 to a host computer system. In some embodiments, instructions and data may be retrieved from the host computer system via interface 202 by a DMA controller 222. The retrieved instructions and data may be stored in memory 208 by communicating with one or more memory controllers 210A and/or 210B (collectively referred to as memory controller 210). The host computer system may provide different instruction and data sets to be stored in memory 208 in order to configure the base card to perform different sets of instrumentation tasks. Each set of instructions and data may correspond to the daughter card(s) currently coupled to the base card. Note that other embodiments of a base card may not include a DMA controller. However, some such embodiments may have other bus mastering capabilities suitable for the bus implementation with which the base card is designed to be used Once data and instructions for a particular operation have been stored in memory 208, the control logic 214 may communicate with the memory controller 210 to request data and instructions from the memory 208. The control logic 214 may also communicate with the memory controller 210 in order to buffer data being transferred between the host computer system and the daughter card(s) in memory 208. Note that memory 208 may be used to buffer data being transferred to the daughter card from the host computer system as well as data being transferred to the host computer system from the daughter card.

In embodiments where the control logic 214 is implemented in a reconfigurable device, an EEPROM 204 (or any other memory device that holds its contents without power) may store configuration information that a host computer system may access when configuring the control logic 214. For example, if the control logic 214 is implemented in a PLD, the host computer system may use configuration information stored in the EEPROM 204 to reprogram the control logic 214 each time the system is powered on.

A timing controller 212 may provide time stamping capability and/or receive external trigger signals from other devices in the instrumentation system. The timing controller 212 may be configured to process and/or route received trigger signals to other sections of the base card 116. The trigger signals may allow execution of instructions by the control logic 214 to be conditioned on whether certain external events occur. Triggers may be received from other instrumentation devices in the instrumentation system. For example, if the base card 116 is coupled in a PXI backplane, triggers from other instrumentation cards may be received via a PXI trigger line. If the instrumentation card 114 is generating a waveform that is provided as stimulus to a UUT, the UUT may produce certain responses to the stimulus. These responses may be received by another instrumentation card in this system, and based on the responses, that card may provide a trigger to the timing controller 212 via a trigger line. Triggers may also be received in response to software setting a trigger. For example, the software controlling a particular process may set a register to a certain value, causing a trigger to be generated and provided to the timing controller 212.

Alternatively, the control logic 214 may be configured to generate trigger signals that indicate the control logic's progress to other devices, such as timing controller 212. Timing controller 212 may responsively provide one or more of these internal trigger signals to another instrumentation device (e.g., via a PXI backplane).

In some embodiments, the control logic 214 may be coupled to a local bus 220. For example, if the base card 116 is coupled to a PXI backplane, a local bus 220 may provide a private communication channel between devices attached to neighboring slots in the PXI system.

Data generated by the control logic 214 may be output to a daughter card via a daughter card interface 218A and/or 218B (collectively referred to as daughter card interfaces 218). Similarly, data generated by one or more daughter cards may be input to the base card via daughter card interface 218A and/or 218B. Each daughter card interface may include a set of pin connectors 224A or 224B (collectively, pin connectors 224) that are configured to connect to a set of pin connectors on a daughter card 118. Each daughter card interface may be configured to size data output by the control logic 214 to the particular data width of the daughter card 118 currently coupled to the interface 218 (e.g., in response to control signals generated by an appropriately programmed PLD implementing control logic 214). Note that in some embodiments, the base card 114 may have fewer or additional daughter card interfaces 218.

The base card 116 may not include an external connector (e.g., to a UUT) in some embodiments. Instead, the base card 116 may include several interfaces for receiving one or more add-in daughter cards 118, and the daughter card(s) 118 may include an external connector. Note that in alternative embodiments, both the base card 116 and the daughter card 118 may include external connectors.

In one embodiment, the base card 116 may be configured to perform generic functions that are common to many types of virtual instrumentation. For example, the base card may be configured to perform functions that may be used in oscilloscopes, multimeters, arbitrary waveform generators (AWGs), digitizers, digital pattern generators and/or receivers, etc. These functions may include both input and output functions. For example, the instrumentation card 114 may be configured to output waveforms to stimulate a UUT or process under test and/or to receive waveforms produced by the UUT in response to stimuli. As noted above, the particular set of functions that the base card is configured to perform may vary depending on the daughter card 118 currently coupled to the base card and the hardware description and/or instructions used to program control logic 214.

The one or more daughter cards 118 coupled to base card 116 may be selected from a set of possible daughter cards. Each of the different possible daughter cards 118 may have a different daughter card configuration. Each daughter card configuration may be configured to adapt the functionality of the base card 116 to perform the function of a specific device (e.g., an oscilloscope, a multimeter, or an arbitrary waveform generator) or a combination of specific devices. Thus, the different daughter card configurations may be thought of as providing different "personalities" for the instrumentation card 114. By using appropriate daughter card configurations to customize the generic functionality of the instrumentation card 114, many different instrumentation systems may be derived from the same base card 116. For example, if the daughter card 118 includes a DAC, the instrumentation card 114 may operate as an arbitrary waveform generator that may provide an analog waveform to a UUT.

When different daughter cards 118 are coupled to base card 116, the pin definitions for the connectors coupling the base card 116 and daughter card 118 may be redefined. As mentioned above, a program such as LabVIEW may be used to create a new personality for the base card 116 (e.g., as described in U.S. Pat. No. 6,219,628). For example, a user may specify the instrumentation tasks to be performed by the reconfigured instrumentation card by creating a graphical program or block diagram that performs or represents the desired functionality. The user may convert the graphical program into executable form. At least a portion of the graphical program may be converted into a hardware implementation for the PLD 120 on the base card 116. The remaining portion of the graphical program may be converted into instructions executable by the reconfigured PLD 120. These instructions may be stored in memory 208 on base card 116. The portion of the graphical program selected for hardware implementation may be exported into a hardware description (e.g., a VHDL description). The hardware description may then be converted into a net list (e.g., an FPGA-specific net list) by a synthesis tool. The net list may be compiled into a program file, also called a software bit stream. In other embodiments, the hardware description is directly converted into a program file. The resulting program file may then be transferred to PLD 120 to produce a programmed PLD equivalent to that portion of the graphical program or block diagram. Note that non-graphical programs may also be used to reconfigure the base card.

The new base card hardware description may include a new pin definition appropriate for the particular daughter card 118 currently being used. For example, if a base card 116 that was previously configured as a primarily output device (e.g., an arbitrary waveform generator) with an appropriate daughter card 118 is reconfigured as a primarily input device (e.g., an image acquisition card) with another daughter card, one or more of the pin connections 224 that were previously defined as output pin connections may be reconfigured as input pin connections. Some pin connections 224 may also be redefined to convey control signals instead of data signals in some embodiments. Thus, the number and type of signals conveyed between the base card 116 and the daughter card 118 may differ for different base card/daughter card combinations.

When the daughter card 118 is connected to the base card 116, the combined instrumentation card may, in some embodiments, include one external bracket and one external connector. Accordingly, the combined card or expansion device may occupy one computer expansion slot (despite including two component cards).

FIGS. 5A–5F—Daughter Cards

Many different daughter cards 118 may be coupled to an instrumentation card 114 like the one shown in FIG. 4. FIGS. 5A–5F each show an example of a different daughter card 118 that may be attached to one embodiment of base card 116. In addition to attaching different daughter cards 118, programmable logic on base card 116 may be reprogrammed and/or reconfigured in order to give the instrumentation card 114 a desired personality. The same daughter cards 118 may be used with different base cards. For example, a daughter card 118 may be compatible with both a PCI-compatible base card and a PXI-compatible base card. In some embodiments, different base cards 116 may be designed to be compatible with other buses (e.g., USB (Universal Serial Bus), IEEE 1394, PCI-X, etc.). Different daughter cards may have different pin definitions for at the pin connections 780 coupling each daughter card to pins 124 on base card 116. Each time a different daughter card is coupled to the base card, the pins 124 on base card 116 may be reconfigured so that the base card can communicate with that particular daughter card.

Figure 5A:
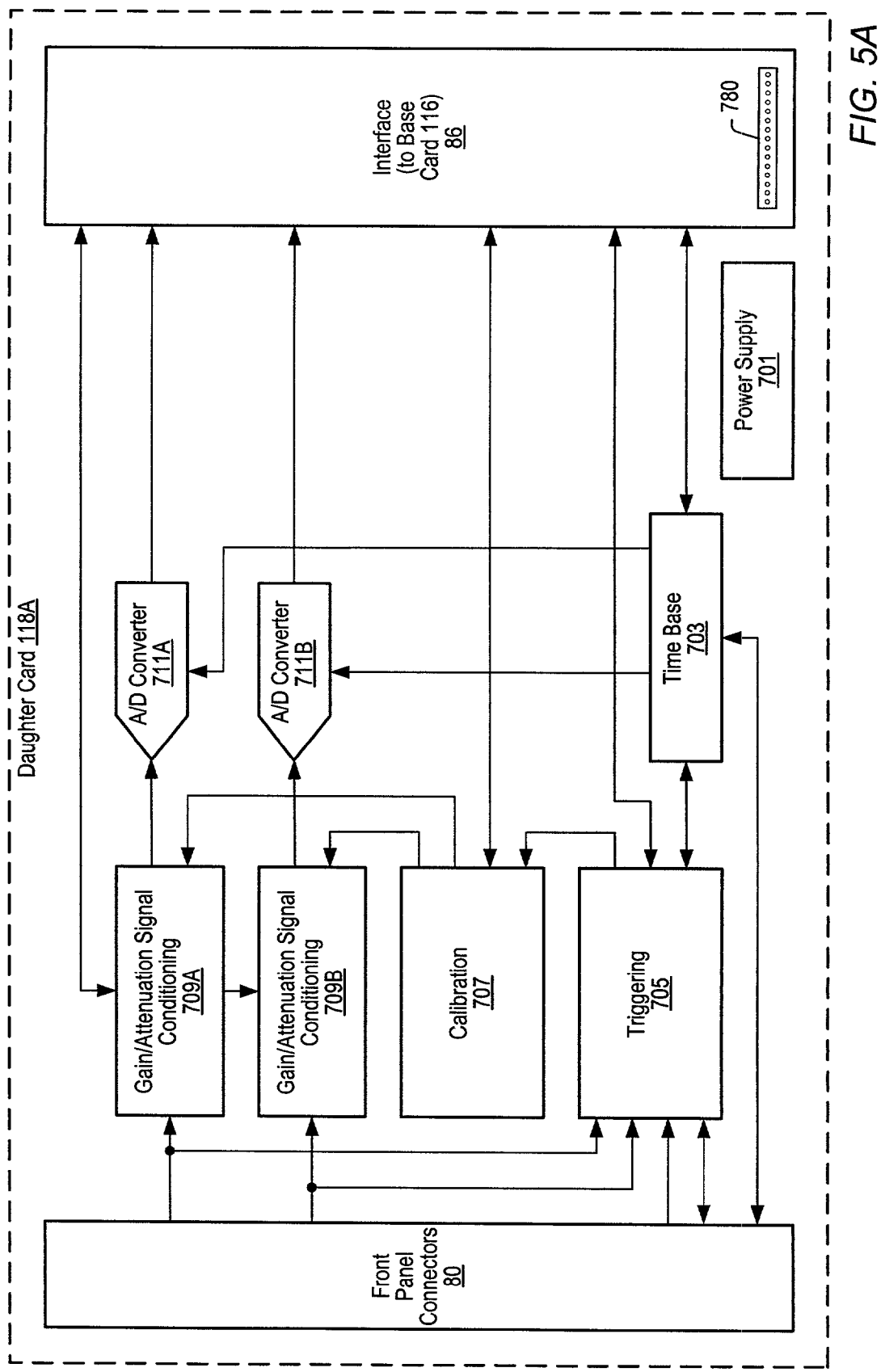
FIGS. 5A–5F show block diagrams of various exemplary embodiments of daughter cards.

FIG. 5A shows an embodiment of a daughter card 118A that may be attached to base card 116 in order to create a high-speed digitizer (e.g., an oscilloscope) instrumentation card 114. Daughter card 118A includes an interface 86 to base card 116, front panel connectors 80, two A/D converters 711A and 711B, time base 703, power supply 701, triggering 705, calibration unit 707, and two gain/attenuation signal conditioning units 709A and 709B. For convenience, devices with the same reference number (e.g., A/D converters 711A and 711B) will be collectively referred to by that reference number alone (e.g., A/D converters 711).

When daughter card 118A is attached to base card 116, the base card may be configured to receive input from a UUT via daughter card 118A. A hardware description may be provided to the PLD implementing control logic 214 in order to program the PLD to perform system timing control, data decimation on data received from the daughter card, storage of data (e.g., received from the daughter card and/or decimated by the PLD), time to digital conversion, interfacing to memory and/or buses, and/or synchronization.

In some embodiments, daughter card 118A may include an RF downconverter configured to receive an RF signal and to generate an analog signal that corresponds to the received RF signal. The RF downconverter may provide the analog signal to an A/D converter 711. When such a daughter card 118A is coupled to a base card 116, the base card 116 may be configured (e.g., by providing instructions for a processor and/or PLD to execute and/or by configuring the PLD according to an appropriate hardware description) to perform a portion of the downconversion in the digital domain by operating on the digital signal provided to the base card 116 by the daughter card 118A.

Figure 5B:
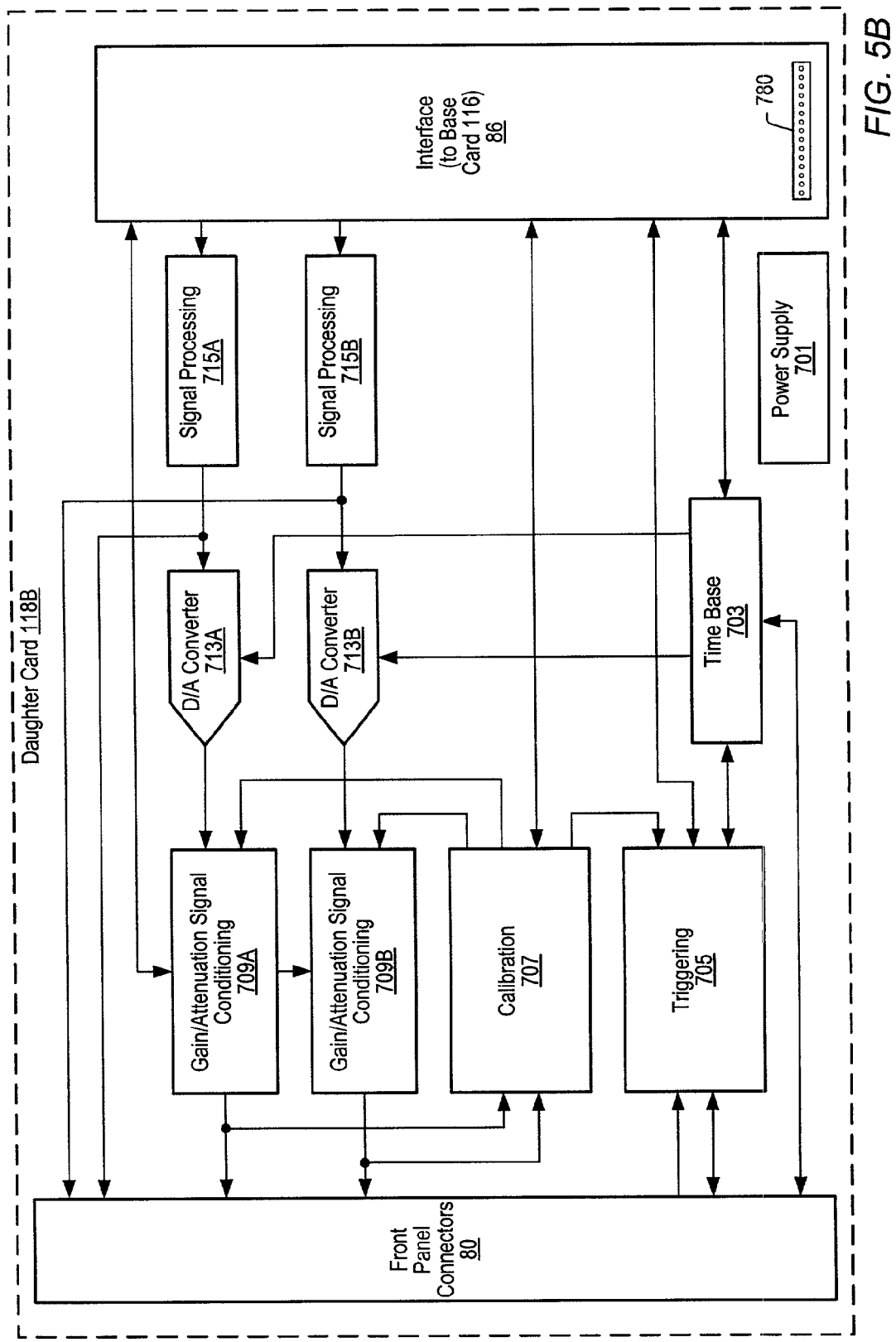

FIG. 5B shows another embodiment of a daughter card 118B that may be attached to base card 116. An instrumentation card 114 that includes base card 116 and daughter card 118B may be used as an analog arbitrary waveform generator. When daughter card 118B is attached to base card 116, base card 116 may be configured to output data via daughter card 118B. Daughter card 118B includes an interface 86 to base card 116, front panel connectors 80, two D/A converters 713, time base 703, power supply 701, triggering 705, calibration unit 707, two signal processing units 715 (e.g., digital interpolation units), and two gain/attenuation signal conditioning units 709. The D/A converters 713 may receive a series of digital waveform samples generated by the base card 116 and convert the series of digital waveform samples into an analog waveform to be output to front panel connectors 80.

When daughter card 118B is coupled to base card 116, the PLD(s) 120 implementing control logic 214 may be reconfigured to perform system timing control, digital pattern generation, bus interfacing, interfacing to one or more daughter card registers (e.g., control or status registers), and multi-board synchronization.

In some embodiments, the daughter card 118B may be configured to generate an RF signal from a digital signal. The daughter card may use a D/A converter 713 to convert a digital signal received from the base card 116 to an analog signal. The daughter card 118B may include an RF upconverter configured to generate an RF signal corresponding to the analog signal. If such a daughter card 118B is coupled to the base card 116, the base card 116 may be configured to perform a portion of the upconversion functions in the digital domain by operating on the digital signal before providing the digital signal to the daughter card.

Figure 5C:
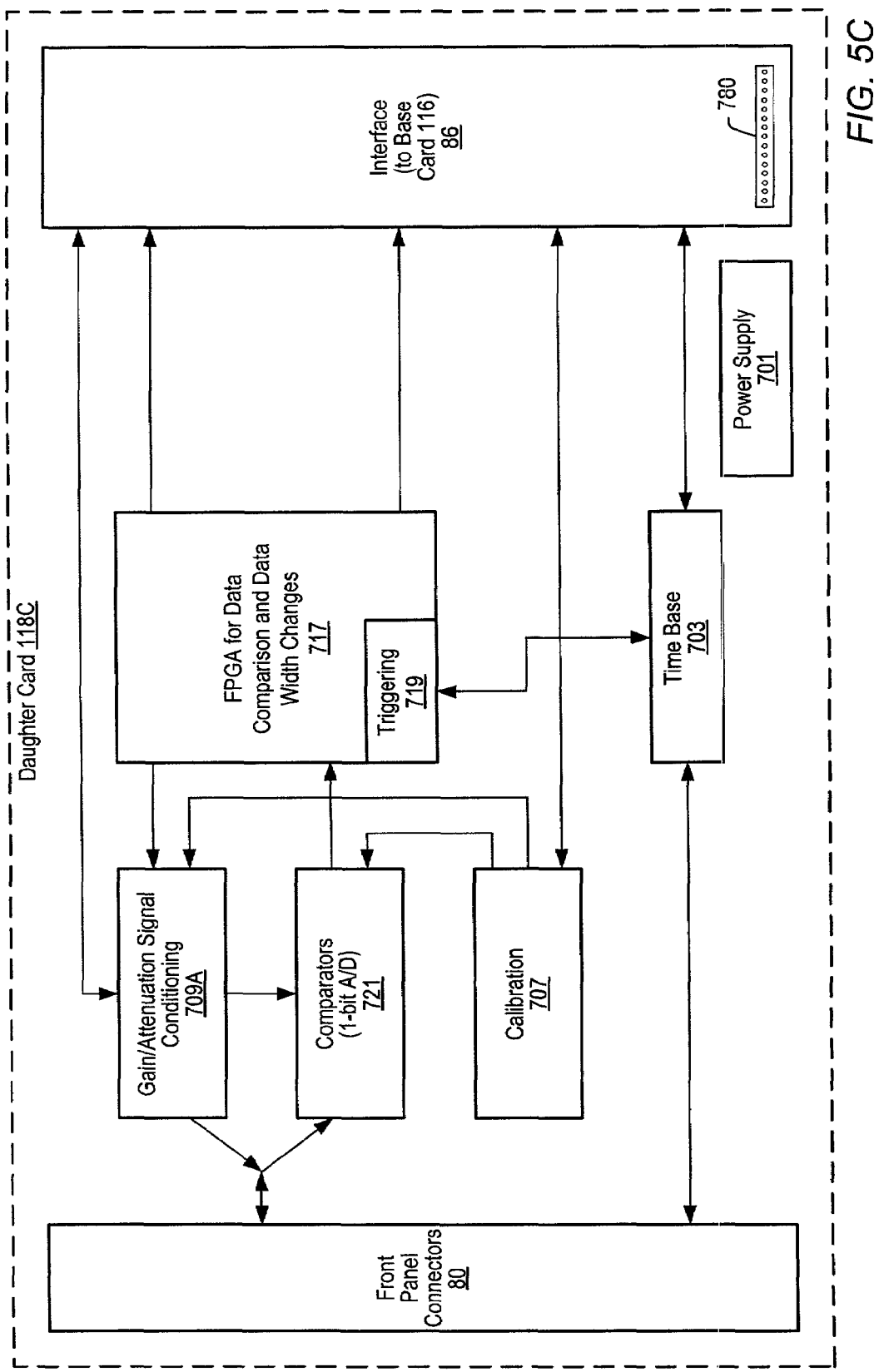

FIG. 5C shows another embodiment of a daughter card 118C that may be attached to base card 116 to form a digital I/O device instrumentation card 114. Daughter card 118C includes an interface 86 to base card 116, front panel connectors 80, pin drivers 723, comparators 721, time base 703, power supply 701, calibration unit 707, and a programmable logic device 717. The programmable logic device 717 may be an FPGA, as shown in FIG. 5C. FPGA 717 may be configured to perform data comparison and/or data width changes. Additionally, FPGA 717 may be programmed as a trigger 719. In one embodiment, comparators 721 may be configured as 1-bit A/D converters.

When daughter card 118C is coupled to base card 116, the PLD may be reconfigured to perform system timing control, to interface to one or more daughter card registers, to perform data decimation and/or storage, to interface to one or more memories, to interface to one or more buses, to synchronize one or more other instrumentation cards (e.g., to a sample clock used by base card 116 and/or daughter card 118 to send or receive digital I/O), to generate digital patterns, and/or to perform data handshaking by transmitting signals back and forth over a communications network in order to establish a valid connection with another device.

Figure 5D:
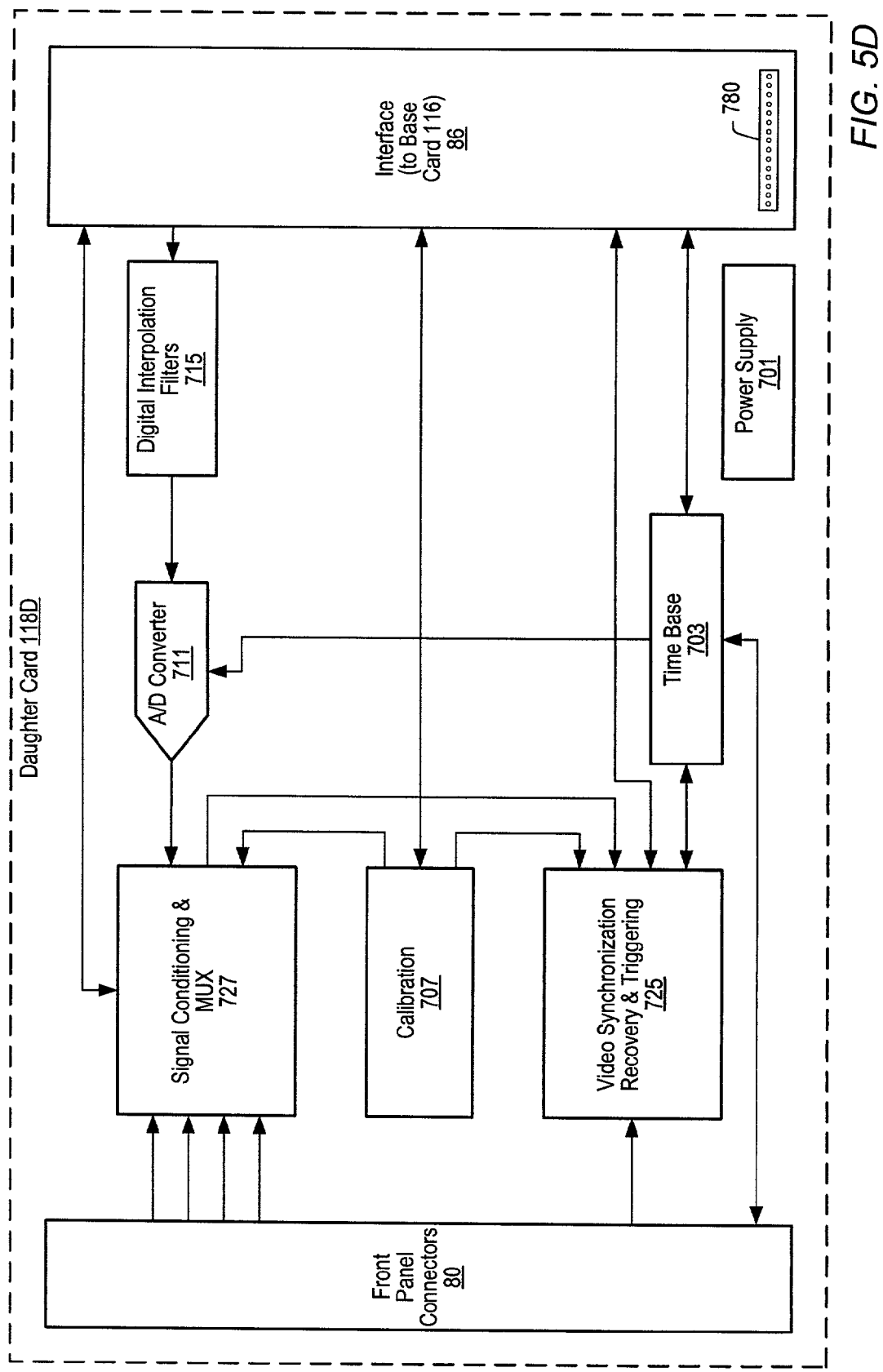

FIG. 5D shows another embodiment of a daughter card 118D that may be attached to base card 116. Base card 116 and daughter card 118D may be used as an image acquisition card 114. When daughter card 118D is coupled to base card 116, base card 116 may be configured to receive input from daughter card 118D. Daughter card 118D includes an interface 86 to base card 116, front panel connectors 80, A/D converter 711, time base 703, power supply 701, video synchronization and triggering unit 725, calibration unit 707, digital interpolation filter 715, and signal conditioning and multiplexing unit 727.

Figure 5E:
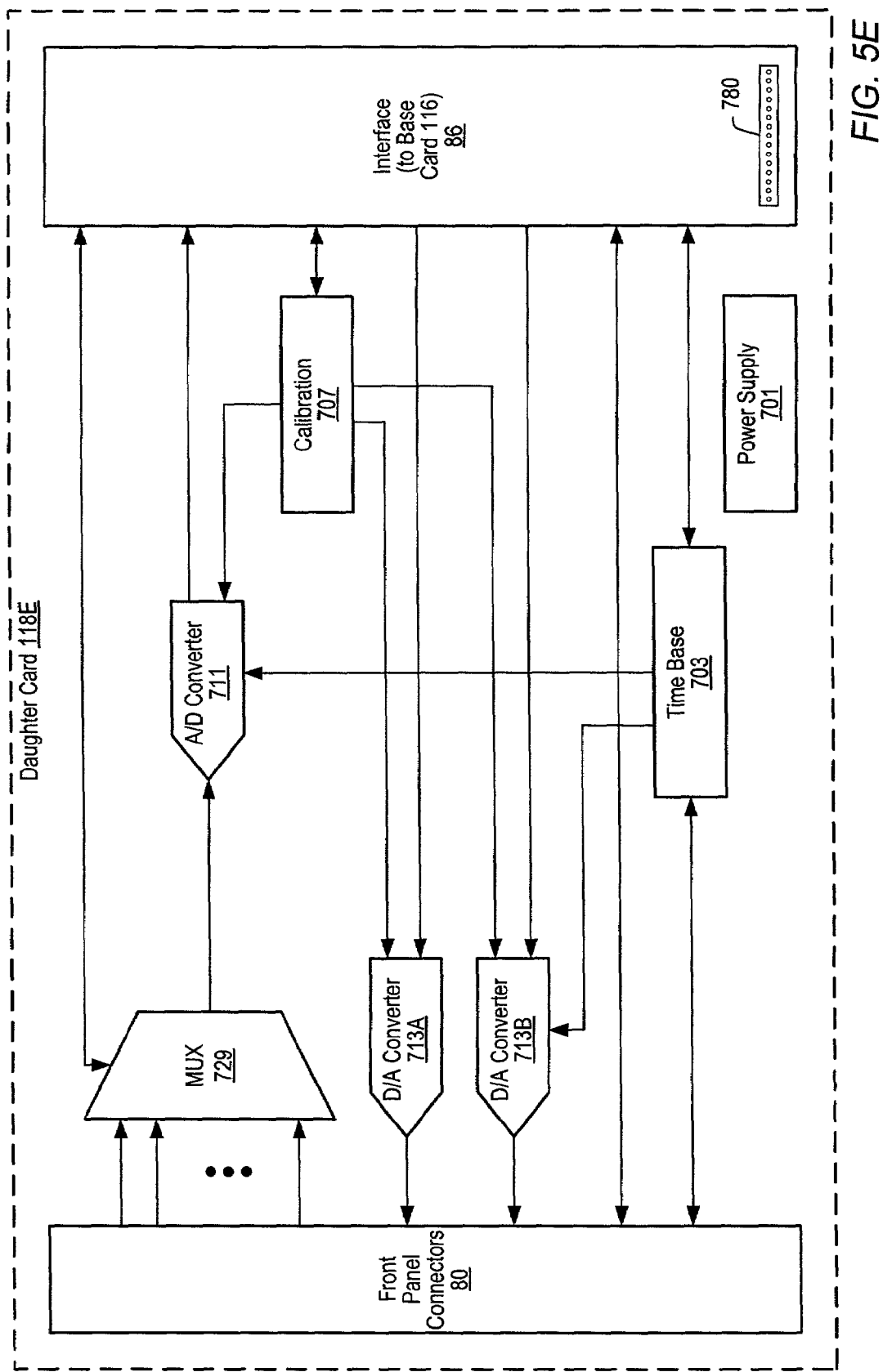
Figure 5F:
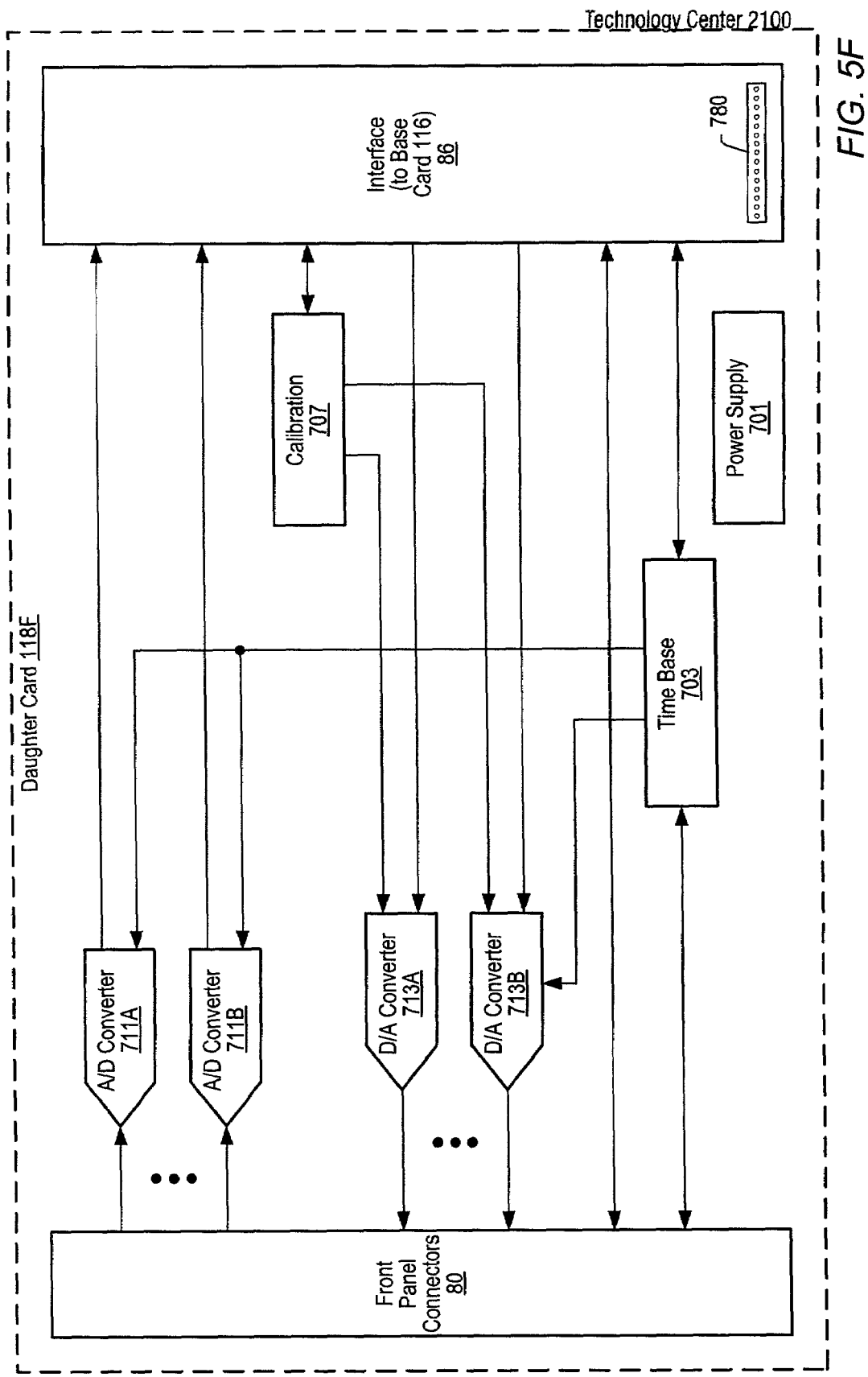

FIG. 5E shows another embodiment of a daughter card 118E that may be attached to base card 116 to form a multifunction I/O instrumentation card 114. Daughter card 118E includes an interface 86 to base card 116, front panel connectors 80, two D/A converters 713, time base 703, power supply 701, calibration unit 707, multiplexer 729, and A/D converter 711. Daughter card 118E may be configured to receive an analog waveform from a unit under test and to provide a series of digital waveform samples to the base card. A/C converter 711 may convert the analog waveform into the series of digital waveform samples that is provided to the base card. FIG. 5F shows another embodiment of a daughter card 118BF that may be attached to base card 116 to form a simultaneously sampling, reconfigurable I/O instrumentation card 114. Daughter card 118F includes an interface 86 to base card 116, front panel connectors 80, several D/A converters 713, time base 703, power supply 701, calibration unit 707, and multiple A/D converters 711.

Although the system and method of the present invention has been described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims.

The invention claimed is:

1. An instrumentation system comprising:
    a base card configurable to perform a plurality of instrumentation tasks, wherein the base card includes a programmable logic device;
    a first daughter card, wherein if the first daughter card is coupled to the base card, the programmable logic device is configured according to a first hardware description and the base card is configured to perform at least a first one of the plurality of instrumentation tasks; and
    a second daughter card, wherein if the second daughter card is coupled to the base card, the programmable logic device is configured according to a second hardware description and the base card is configured to perform at least a second one of the plurality of instrumentation tasks.

2. The instrumentation system of claim 1, wherein the at least a first one of the plurality of instrumentation tasks comprises waveform generation.

3. The instrumentation system of claim 2, wherein the first daughter card comprises a D/A (digital-to-analog) converter coupled to receive a series of digital waveform samples generated by the base card and configured to convert the series of digital waveform samples into an analog waveform.

4. The instrumentation system of claim 3, wherein the first daughter card comprises an upconverter configured to convert the analog waveform into an RF signal, and wherein the plurality of instrumentation tasks include performing upconversion in the digital domain on the digital waveform samples before providing the digital waveform samples to the daughter card.

5. The instrumentation system of claim 1, wherein the at least a second one of the plurality of instrumentation tasks comprises data acquisition.

6. The instrumentation system of claim 5, wherein the second daughter card comprises a A/D (analog-to-digital) converter coupled to receive an analog waveform and to provide a series of digital waveform samples to the base card, wherein the A/D converter is configured to convert the analog waveform into the series of digital waveform samples.

7. The instrumentation system of claim 6, wherein the second daughter card comprises a downconverter configured to receive an RF signal and to convert the RF signal into the analog waveform, wherein the plurality of instrumentation tasks include performing downconversion in the digital domain on the digital waveform samples received from the daughter card.

8. The instrumentation system of claim 1, wherein the base card includes a reconfigurable pin connector configured to be coupled to a respective pin connector included in one of the first and the second daughter cards, wherein the first hardware description includes a first pin definition for the reconfigurable pin connector and the second hardware description includes a second pin definition for the reconfigurable pin connector.

9. The instrumentation system of claim 1, wherein the base card is configured to be coupled to a PCI (Peripheral Component Interconnect) bus.

10. The instrumentation system of claim 9, wherein the first daughter card is configured to be coupled to the base card and to be coupled to a second base card configured to be coupled to a PXI (PCI Extensions for Instrumentation) bus.

11. The instrumentation system of claim 9, wherein the first daughter card is configured to be coupled to the base card and to be coupled to a second base card configured to be coupled to a PXI Express bus.

12. The instrumentation system of claim 9, wherein the first daughter card is configured to be coupled to the base card and to be coupled to a second base card configured to be coupled to an IEEE 1394 bus.

13. The instrumentation system of claim 9, wherein the first daughter card is configured to be coupled to the base card and to be coupled to a second base card configured to be coupled to a Compact PCI bus.

14. The instrumentation system of claim 1, further comprising a host computer system including a processor and a memory coupled to the processor, wherein the memory is configured to store a first program implementing the first portion of the instrumentation tasks, wherein the memory is further configured to store a second program executable by the processor to generate the first hardware description from at least a portion of the first program, and wherein the host computer system is configured to convey the first hardware description to the base card.

15. The instrumentation system of claim 14, wherein the first program is a graphical program.

16. The instrumentation system of claim 14, wherein the second program is further executable by the processor to generate a series of instructions from a second portion of the first program, wherein the host computer system is configured to convey the series of instructions to the base card, and wherein at least a portion of the series of instructions are executable by the programmable logic device when the programmable logic device is configured according to the first hardware description.

17. The instrumentation system of claim 16, wherein the base card includes a base card processor, wherein the base card processor is configured to execute at least a portion of the series of instructions.

18. The instrumentation system of claim 17, wherein the base card processor is configured to execute a first portion of the series of instructions that implements a data processing function and wherein the programmable logic device is configured to execute a second portion of the series of instructions that implements a data transfer function.

19. The instrumentation system of claim 16, wherein the base card includes a base card memory configured to store the series of instructions.

20. The instrumentation system of claim 19, wherein the base card includes a DMA (Direct Memory Access) device coupled to the base card memory and configured to control a transfer of the series of instructions from the memory to the base card memory.

21. The instrumentation system of claim 1, wherein the programmable logic device implements a processor when the programmable logic device is configured according to the first hardware description.

22. The instrumentation system of claim 1, wherein the base card includes a base card memory configured to buffer data being transferred between a host computer system and a daughter card coupled to the base card.

23. The instrumentation system of claim 1, wherein the first daughter card and the second daughter card each include at least one front panel connector and wherein the base card does not include a front panel connector.

24. An instrumentation system comprising:
a host computer system; and
an instrumentation card coupled to the host computer system, wherein the instrumentation card is configurable to perform a plurality of instrumentation tasks, wherein the instrumentation card comprises:
a base card comprising a programmable logic device; and
at least one daughter card coupled to the base card, wherein a type of the at least one daughter card determines which one of a plurality of hardware descriptions is used to configure the programmable logic device and which portion of the instrumentation tasks the instrumentation card is currently configured to perform.

25. The instrumentation system of claim 24, wherein the base card includes a reconfigurable pin connector configured to be coupled to a respective pin connector included in the at least one daughter card, wherein a first hardware description used to configure the programmable logic device also includes a pin definition for the reconfigurable pin connector, wherein the reconfigurable pin connector is configured according to the pin definition.

26. The instrumentation system of claim 24, wherein the base card is configured to be coupled to a PCI (Peripheral Component Interconnect) bus.

27. The instrumentation system of claim 26, wherein the at least one daughter card is configured to be coupled to the base card and to be coupled to a second base card configured to be coupled to a PXI (PCI Extensions for Instrumentation) bus.

28. The instrumentation system of claim 26, wherein the at least one daughter card is configured to be coupled to the base card and to be coupled to a second base card configured to be coupled to a PXI Express bus.

29. The instrumentation system of claim 26, wherein the at least one daughter card is configured to be coupled to the base card and to be coupled to a second base card configured to be coupled to an IEEE 1394 bus.

30. The instrumentation system of claim 26, wherein the at least one daughter card is configured to be coupled to the base card and to be coupled to a second base card configured to be coupled to a Compact PCI bus.

31. The instrumentation system of claim 24, wherein the host computer system comprises a processor and a memory coupled to the processor, wherein the memory is configured to store a first program implementing the portion of the instrumentation tasks that the instrumentation card is currently configured to perform, wherein the memory is further configured to store a second program executable by the processor to generate a first hardware description used to configured to programmable logic device from at least a portion of the first program, and wherein the host computer system is configured to convey the first hardware description to the base card.

32. The instrumentation system of claim 31, wherein the first program is a graphical program.

33. The instrumentation system of claim 31, wherein the second program is further executable by the processor to generate a series of instructions from a second portion of the first program, wherein the host computer system is configured to convey the series of instructions to the base card, and wherein at least a portion of the series of instructions are executable by the programmable logic device when the programmable logic device is configured according to the first hardware description.

34. The instrumentation system of claim 33, wherein the base card includes a base card processor, wherein the base card processor is configured to execute at least a portion of the series of instructions.

35. The instrumentation system of claim 34, wherein the base card processor is configured to execute a first portion of the series of instructions that implements a data processing function and wherein the programmable logic device is configured to execute a second portion of the series of instructions that implements a data transfer function.

36. The instrumentation system of claim 33, wherein the base card includes a base card memory configured to store the series of instructions.

37. The instrumentation system of claim 36, wherein the base card includes a DMA (Direct Memory Access) device coupled to the base card memory and configured to control a transfer of the series of instructions from the memory to the base card memory.

38. The instrumentation system of claim 24, wherein the programmable logic device implements a processor when the programmable logic device is configured according to the first hardware description.

39. The instrumentation system of claim 24, wherein the base card includes a base card memory configured to buffer data being transferred between a host computer system and the at least one daughter card coupled to the base card.

40. The instrumentation system of claim 24, wherein the at least one daughter card includes at least one front panel connector and wherein the base card does not include a front panel connector.

41. A method of reconfiguring an instrumentation system, the method comprising:
configuring an instrumentation card to perform a first set of tasks, wherein the instrumentation card comprises a base card and at least one daughter card, wherein the base card comprises a programmable logic device, wherein said configuring comprises coupling a first type of daughter card to the base card and configuring the programmable logic device according to a first hardware description;
configuring the instrumentation card to perform a second set of tasks by coupling a second type of daughter card to the base card and configuring the programmable logic device according to a second hardware description.

42. The method of claim 41, wherein the first set of tasks comprises waveform generation.

43. The method of claim 42, wherein the first type of daughter card comprises a D/A (digital-to-analog) converter coupled to receive a series of digital waveform samples generated by the base card and configured to convert the series of digital waveform samples into an analog waveform.

44. The method of claim 41, wherein the second set of tasks comprises data acquisition.

45. The method of claim 44, wherein the second type of daughter card comprises a AID (analog-to-digital) converter coupled to receive an analog waveform from a unit under test and to provide a series of digital waveform samples to the base card, wherein the A/D converter is configured to convert the analog waveform into the series of digital waveform samples.

46. The method of claim 41, wherein said configuring the instrumentation card to perform the first set of tasks includes configuring a reconfigurable pin connector included in the base card according to a first pin definition, wherein the reconfigurable pin connector is configured to be coupled to a respective pin connector included in the at least one daughter card, wherein the first hardware description includes the first pin definition.

47. The method of claim 41, wherein the base card is configured to be coupled to a PCI (Peripheral Component Interconnect) bus.

48. The method of claim 47, wherein the at least one daughter card is configured to be coupled to the base card and to be coupled to a second base card configured to be coupled to at least one of: a PXI (PCI Extensions for Instrumentation) bus, a PXI Express bus, an IEEE 1394 bus, and a Compact PCI bus.

49. The method of claim 41, further comprising creating a first program implementing the first portion of the instrumentation tasks and generating the first hardware description from at least a portion of the first program.

50. The method of claim 49, wherein the first program is a graphical program.

51. The method of claim 49, further comprising generating a series of instructions from a second portion of the first program and the programmable logic device executing at least a portion of the series of instructions.

52. The method of claim 51, further comprising a processor included in the base card executing at least a portion of the series of instructions.

53. The method of claim 51, further comprising storing the series of instructions in a memory included in the base card.

54. The method of claim 53, further comprising a DMA (Direct Memory Access) device included in the base card controlling a transfer of the series of instructions from a host computer system memory to the base card memory.

55. The method of claim 41, wherein said configuring the programmable logic device according to a first hardware description comprises configuring the programmable logic device to implement a processor.

56. The method of claim 41, further comprising a memory included in the base card buffering data being transferred between a host computer system and the at least one daughter card coupled to the base card.

57. An instrumentation system comprising:
a base card configurable to perform a plurality of instrumentation tasks, wherein the base card includes:
a programmable logic device, wherein the programmable logic device is programmable with a first hardware description of a plurality of possible hardware descriptions; and
a slot for receiving a first daughter card selected from a plurality of possible daughter cards;
the first daughter card selected from the plurality of possible daughter cards, wherein the first daughter card is operable to be coupled to the slot of the base card;
wherein the base card is configurable to perform a first instrumentation task of the plurality of instrumentation tasks based on selection of the first hardware description and selection of the first daughter card.

58. The instrumentation system of claim 57, further comprising:
a second daughter card selected from the plurality of possible daughter cards, wherein the second daughter card is operable to be coupled to the slot of the base card;
wherein when the second daughter card is coupled to the base card, and the programmable logic device is configured according to a second hardware description, the instrumentation system is configured to perform a second instrumentation task of the plurality of instrumentation tasks.

59. The instrumentation system of claim 57, further comprising a host computer system memory which stores the plurality of possible hardware descriptions.

60. The instrumentation system of claim 57, wherein the first instrumentation task of the plurality of instrumentation tasks comprises waveform generation.

61. The instrumentation system of claim 60, wherein the first daughter card comprises a D/A (digital-to-analog) converter coupled to receive a series of digital waveform samples generated by the base card and configured to convert the series of digital waveform samples into an analog waveform.

62. The instrumentation system of claim 57, wherein the second instrumentation task of the plurality of instrumentation tasks comprises data acquisition.

63. The instrumentation system of claim 62, wherein the second daughter card comprises a A/D (analog-to-digital) converter coupled to receive an analog waveform from a unit under test and to provide a series of digital waveform samples to the base card, wherein the AID converter is configured to convert the analog waveform into the series of digital waveform samples.

64. The instrumentation system of claim 57, wherein the base card includes a reconfigurable pin connector configured to be coupled to a respective pin connector included in one of the plurality of possible daughter cards, wherein each of the plurality of possible hardware descriptions includes a pin definition for the reconfigurable pin connector corresponding to one of the plurality of possible daughter cards.

65. The instrumentation system of claim 57, further comprising host computer system, wherein the host computer system includes a processor and a memory coupled to the processor, wherein the memory is configured to store a first program implementing the first instrumentation task, wherein the memory is further configured to store a second program executable by the processor to generate the first hardware description from at least a portion of the first program, and wherein the host computer system is configured to convey the first hardware description to the base card.

66. The instrumentation system of claim 65, wherein the first program is a graphical program.

67. The instrumentation system of claim 65, wherein the second program is further executable by the processor to generate a series of instructions from a second portion of the first program, wherein the host computer system is configured to convey the series of instructions to the base card, and wherein at least a portion of the series of instructions are executable by the programmable logic device when the programmable logic device is configured according to the first hardware description.

68. The instrumentation system of claim 67, wherein the base card includes a base card processor, and wherein the base card processor is configured to execute at least a portion of the series of instructions.

69. The instrumentation system of claim 57, wherein the base card is configured to be coupled to one of: a PCI (Peripheral Component Interconnect) bus, a PXI (PCI Extensions for Instrumentation) bus, a PXI Express bus, an IEEE 1394 bus, and a Compact PCI bus, and wherein the at least one daughter card is configured to be coupled to at least one other base card that is configured to be coupled to a different type of bus than the base card.

70. A system for configuring an instrumentation system to perform one of a plurality of possible instrumentation tasks, the system comprising:
a computer system, comprising:
a processor;
a memory medium coupled to the processor which stores a plurality of hardware descriptions; and
a slot coupled to the processor and memory medium adapted to receiving a base card;
a base card configurable to perform a plurality of instrumentation tasks, wherein the base card is adapted to be coupled to the slot of the computer system, wherein the base card includes:
a programmable logic device, wherein the programmable logic device is programmable with one of the plurality of hardware descriptions; and
a slot for receiving a daughter card selected from a plurality of daughter cards; the plurality of possible daughter cards, wherein each of the daughter cards is operable to be coupled to the slot of the base card;
wherein the base card is configurable with one of the plurality of daughter cards and one of the plurality of hardware descriptions to perform one of a plurality of possible instrumentation tasks.

71. The instrumentation system of claim 70, wherein the one of the plurality of possible instrumentation tasks includes waveform generation.

72. The instrumentation system of claim 71, wherein the daughter card selected from the plurality of daughter cards comprises a D/A (digital-to-analog) converter coupled to receive a series of digital waveform samples generated by the base card and configured to convert the series of digital waveform samples into an analog waveform.

73. The instrumentation system of claim 70, wherein the one of the plurality of possible instrumentation tasks includes data acquisition.

74. The instrumentation system of claim 73, wherein the daughter card selected from the plurality of daughter cards comprises a AID (analog-to-digital) converter coupled to receive an analog waveform from a unit under test and to provide a series of digital waveform samples to the base card, wherein the A/D converter is configured to convert the analog waveform into the series of digital waveform samples.

75. The instrumentation system of claim 70, wherein the base card includes a reconfigurable pin connector configured to be coupled to a respective pin connector included in one of the plurality of possible daughter cards, wherein each of the plurality of hardware descriptions includes a pin definition for the reconfigurable pin connector corresponding to one of the plurality of possible daughter cards.

76. The instrumentation system of claim 70, wherein the memory medium is configured to store a first program implementing the first instrumentation task, wherein the memory medium is further configured to store a second program executable by the processor to generate the first hardware description from at least a portion of the first program, and wherein the computer system is configured to convey the first hardware description to the base card.

77. The instrumentation system of claim 76, wherein the first program is a graphical program.

78. The instrumentation system of claim 77, wherein the second program is further executable by the processor to generate a series of instructions from a second portion of the first program, wherein the computer system is configured to convey the series of instructions to the base card, and wherein at least a portion of the series of instructions are executable by the programmable logic device when the programmable logic device is configured according to the one of the plurality of hardware descriptions.

79. The instrumentation system of claim 78, wherein the base card includes a base card processor, and wherein the base card processor is configured to execute at least a portion of the series of instructions.

80. The method of claim 70, wherein the base card is configured to be coupled to one of: a PCI (Peripheral Component Interconnect) bus, a PXI (PCI Extensions for Instrumentation) bus, a PXI Express bus, an IEEE 1394 bus, and a Compact PCI bus, and wherein the at least one daughter card is configured to be coupled to at least one other base card that is configured to be coupled to a different type of bus than the base card. card comprises a A/D (analog-to-digital) converter coupled to receive an analog waveform and to provide a series of digital waveform samples to the base card, wherein the A/D converter is configured to convert the analog waveform into the series of digital.

* * * * *

UNITED STATES PATENT AND TRADEMARK OFFICE
CERTIFICATE OF CORRECTION

PATENT NO. : 7,089,466 B2  Page 1 of 1
APPLICATION NO. : 10/194720
DATED : August 8, 2006
INVENTOR(S) : Odom et al.

It is certified that error appears in the above-identified patent and that said Letters Patent is hereby corrected as shown below:

Column 10
Line 56, please delete "e.g., AID converters" and substitute -- e.g., A/D converters --;

Column 16
Line 23, please delete "comprises a AID (analog-to-digital)" and substitute -- comprises a A/D (analog-to-digital) --;

Column 17
Line 54, please delete "wherein the AID converter is" and substitute -- wherein the A/D converter is --;

Column 19
Line 3, please delete "comprises a AID (analog-to-digital)" and substitute -- comprises a A/D (analog-to-digital) --;

Column 20
Lines 19 - 24, please delete "type of bus than the base card. card comprises a A/D (analog-to-digital) converter coupled to receive an analog waveform and to provide a series of digital waveform samples to the base card, wherein the A/D converter is configured to convert the analog waveform into the series of digital." and substitute -- type of bus than the base card. --.

Signed and Sealed this

Fifth Day of December, 2006

JON W. DUDAS
*Director of the United States Patent and Trademark Office*